(12) United States Patent
Hiroi

(10) Patent No.: US 6,373,267 B1
(45) Date of Patent: Apr. 16, 2002

(54) BALL GRID ARRAY-INTEGRATED CIRCUIT TESTING DEVICE

(75) Inventor: Hajime Hiroi, Tokyo (JP)

(73) Assignee: Ando Electric Company, Tokyo (JP)

( * ) Notice: Subject to any disclaimer, the term of this patent is extended or adjusted under 35 U.S.C. 154(b) by 0 days.

(21) Appl. No.: 09/070,339

(22) Filed: Apr. 30, 1998

(30) Foreign Application Priority Data

May 30, 1997 (JP) .............................................. 9-157939

(51) Int. Cl.[7] .............................................. G01R 31/02
(52) U.S. Cl. ........................ 324/754; 324/755; 324/765
(58) Field of Search ................................ 324/754, 755, 324/765; 439/66, 70, 71, 74; 361/751, 714, 725; 257/48, 773, 737, 780; 438/18

(56) References Cited

U.S. PATENT DOCUMENTS

| | | | | |
|---|---|---|---|---|
| 5,585,162 A | * | 12/1996 | Schueller | 361/751 |
| 5,691,041 A | * | 11/1997 | Frankeny et al. | 439/74 |
| 5,702,255 A | * | 12/1997 | Murphy et al. | 439/71 |
| 5,730,606 A | * | 3/1998 | Sinclair | 439/70 |
| 5,931,685 A | * | 8/1999 | Hembree et al. | 439/74 |
| 5,932,891 A | * | 8/1999 | Higashi et al. | 439/66 |
| 5,952,840 A | * | 9/1999 | Farnworth et al. | 324/755 |
| 5,962,921 A | * | 10/1999 | Farnworth et al. | 257/773 |

* cited by examiner

Primary Examiner—Vinh P. Nguyen
(74) Attorney, Agent, or Firm—Flynn, Thiel, Boutell & Tanis, P.C.

(57) ABSTRACT

A measuring mechanism for a BGA-IC capable of facilitating and assuring the contact between a soldering ball of a BGA-IC and a BGA contact seat even if a foreign matter is sandwiched therebetween, and also capable of saving time involved in recontact therebetween, and of shortening measuring time. The measuring mechanism for a BGA-IC comprising a substrate including a BGA contact seat which is embedded therein and has a conical contact surface, wherein the BGA contact seat is connected to a tester, and the BGA-IC has the soldering ball and wherein the soldering ball contacts the conical contact surface of the BGA contact seat when the BGA-IC is tested.

3 Claims, 4 Drawing Sheets

BALL GRID ARRAY-INTEGRATED CIRCUIT TESTING DEVICE

BACKGROUND OF THE INVENTION

1. Field of the Invention

The present invention relates to a measuring mechanism for an assembled or a packaged BGA (Ball Grid Array)-IC, particularly to a measuring mechanism for measuring a packaged BGA-IC and the package of the BGA-IC capable of facilitating and assuring contact between a soldering ball and a contact seat for a BGA, and of shortening measuring time when the package of the BGA-IC and packaged BGA-IC are measured. The measurement of both the packaged BGA-IC and the package of the BGA-IC is hereinafter defined as the measurement of the BGA-IC.

2. Prior Art

In the conventional technique, a measuring mechanism for testing or measuring a BGA-IC has an arrangement, for example, as shown in FIG. 4(A) and 4(B).

In these figures, the measuring mechanism comprises, a substrate 60 composed of a contact seat 61 for contacting a soldering ball 71 of a BGA-IC 70 (hereinafter referred to as BGA contact seat 61), signal connection patterns 62 and 64, a signal connection through hole 63, and a measuring contact seat 65 for connecting to a tester, not shown.

The BGA contact seat 61 is formed on the substrate 60 and it is circular and flat.

The BGA contact seat 61 is connected to the measuring contact seat 65, which is positioned at the tester side and opposite to the BGA contact seat 61, through the signal connection pattern 62, the signal connection through hole 63 and the signal connection pattern 64. The measuring contact seat 65 is connected to a circuit such as a pin electronic circuit at the tester side.

With such an arrangement, when the BGA-IC 70 is tested, the soldering ball 71 of the BGA-IC 70 is forced to contact the BGA contact seat 61 so that the assembled BGA-IC 70 can be tested in its electric characteristics.

However, in the conventional measuring mechanism for a BGA-IC, the surface of the BGA contact seat 61 formed on the substrate 60 is flat. On the other hand, the surface of the soldering ball 71 of the BGA-IC 70 is spherical. Accordingly, the soldering ball 71 and the BGA contact seat 61 contact each other at a point, namely, they contact each other in a point contact mode (FIG. 4(B)).

That is, as shown in FIG. 4(B), the soldering ball 71 contacts the BGA contact seat 61 at a point 71A.

Accordingly, if a foreign matter 80 is sandwiched between the soldering ball 71 and the BGA contact seat 61 as shown in FIG. 5, the BGA contact seat 61 and the soldering ball 71 do not normally contact each other, so that inferior contact occurs, which makes it difficult to measure the BGA-IC 70.

That is, since the soldering ball 71 contact the BGA contact seat 61 at the point 71A alone (FIG. 4(B)), it can not contact the BGA contact seat 61 in other portions if the foreign matter 80 is sandwiched between the soldering ball 71 and the BGA contact seat 61, which makes them inferior in contact.

SUMMARY OF THE INVENTION

It is an object of the invention to provide a measuring mechanism for a BGA-IC capable of assuring and facilitating the contact between a soldering ball of a BGA-IC and a BGA contact seat even if a foreign matter is sandwiched therebetween, and also capable of saving time involved in checking of the recontact therebetween, thereby shortening measuring time.

To achieve the above object, the invention comprises a substrate 30 including a BGA contact seat 10 which is embedded therein and has a conical contact surface 10A, and is connected to a tester, and a BGA-IC 40 having a soldering ball 41 wherein the soldering ball 41 contacts the conical contact surface 10A of the BGA contact seat 10 when the BGA-IC 40 is tested.

With such an arrangement, since the conical contact surface 10A of the BGA contact seat 10 is conical (FIGS. 1, 2 and 3), the entire outer periphery 41A of the soldering ball 41 of the BGA-IC 40 can contact the BGA contact seat 10 so that they can contact each other in a line contact mode, and hence even if a foreign matter 50 is sandwiched between the soldering ball 41 and the BGA contact seat 10, they can contact each other at the other portions other than the portion where the foreign matter 50 is sandwiched therebetween.

Further, since the contact between the soldering ball 41 and the BGA contact seat 10 can be facilitated and assured compared in the point contact mode at the point 71A as explained with reference to FIGS. 4 and 5, it is not necessary to check the recontact therebetween, and hence measuring time can be shortened by the time involved in checking the recontact therebetween.

That is, since the conical contact surface 10A of the BGA contact seat 10 is conical, the conical contact surface 10A can contact the BGA-IC 40 at any part of the conical contact surface 10A even if the foreign matter 50 is sandwiched between the soldering ball 41 and the BGA contact seat 10, and hence the contact therebetween can be facilitated and assured, thereby saving time involved in checking the recontact therebetween to shorten the measuring time.

PREFERRED EMBODIMENT OF THE INVENTION

A measuring mechanism for a BGA-IC according to a preferred embodiment of the invention will be now described with reference to FIGS. 1 to 3.

In FIG. 1, denoted by 10 is a BGA contact seat, 10A is a conical contact surface, 20 is a measuring contact seat, 21 is a signal connection pattern, 22 is a signal connection through hole, 30 is a substrate, 40 is a BGA-IC and 41 is a soldering ball.

Figure 1A:
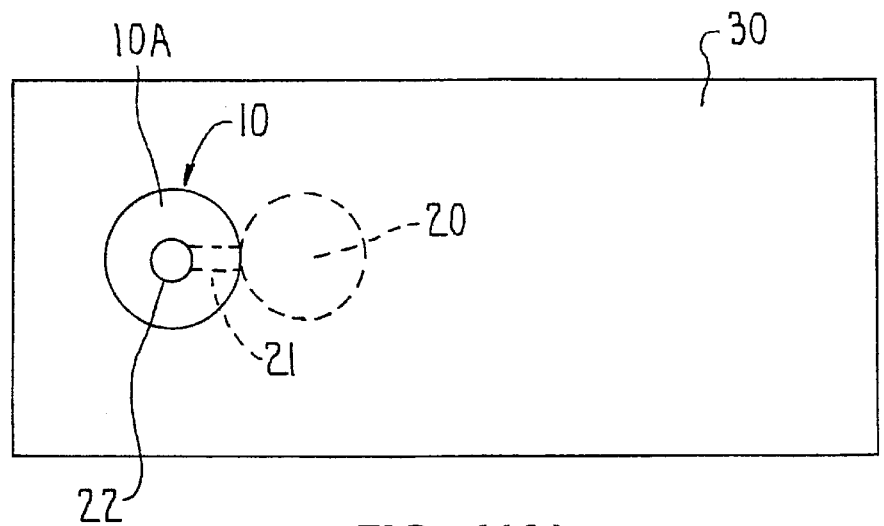
FIGS. 1(A) and 1(B) are views showing the arrangement of a measuring mechanism for a BGA-IC according to a preferred embodiment of the invention.
Figure 1B:
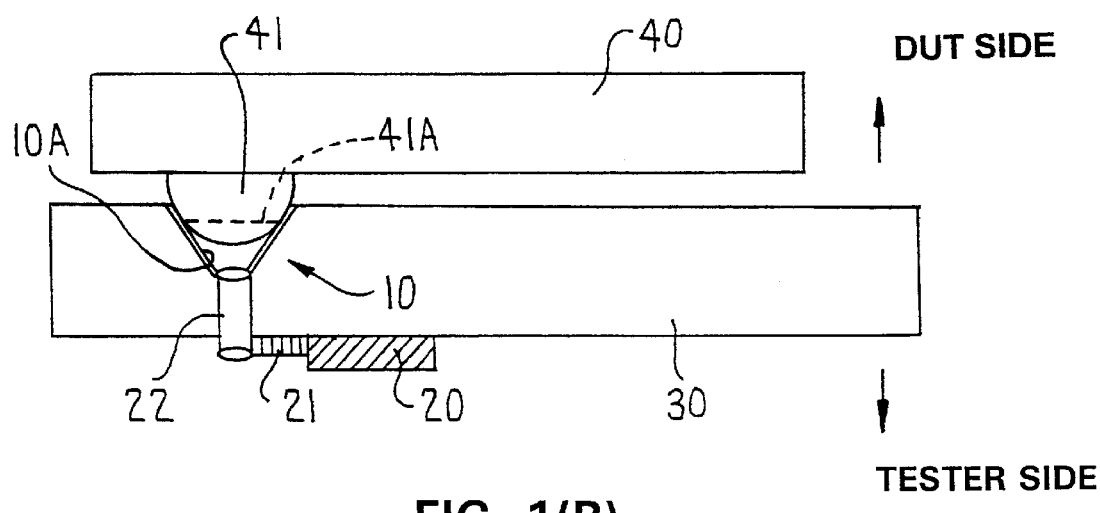

FIG. 1(A) is a plan view of the measuring mechanism for a BGA-IC according to the invention, and FIG. 1(B) is a side view of the measuring mechanism for a BGA-IC wherein the soldering ball 41 of the BGA-IC 40 contacts the measuring mechanism for a BGA-IC. The upper portion of the substrate 30 in FIG. 1(B) is a DUT side, namely, the BGA-IC 40 side, and the lower portion thereof is a tester side.

The BGA contact seat 10 is embedded into the substrate 30 at the DUT side. The conical contact surface 10A of the BGA contact seat 10 is conical as shown in FIG. 1(B) and it is formed of a conductive material as a whole.

In other words, the BGA contact seat 10 has a funnel shape as a whole and the conical contact surface 10A inside the BGA contact seat 10 is formed of a conductive material.

The signal connection through hole 22 is connected to the lower portion of the BGA contact seat 10 and it penetrates the substrate 30 to protrude from the back surface of the substrate 30 toward the tester side (FIG. 1(B)).

The signal connection pattern 21 implemented on the substrate 30 at the tester side is connected to the tip end of the signal connection through hole 22 protruding toward the tester side, and the measuring contact seat 20 implemented on the substrate 30 at the tester side is connected to the signal connection pattern 21. A circuit such as a pin electronic circuit at the tester side is connected to the measuring contact seat 20. The substrate 30 on which the BGA contact seat 10, the signal connection through hole 22, the signal connection pattern 21 and the measuring contact seat 20 are respectively implemented can be replaced with another together with these components.

Accordingly, for example, when the BGA contact seat 10 is replaced with another during the maintenance of the measuring mechanism for a BGA-IC, the substrate 30 is removed as a whole and a new substrate 30 is mounted. Meanwhile, the BGA-IC 40 is an IC provided with a plurality of hemispherical soldering balls 41 and such soldering balls 41 are arranged in length and width for every pin. As a result, a plurality of BGA contact seats 10 are embedded in the substrate 30 corresponding to the plurality of soldering balls 41 (FIG. 3).

Likewise, a plurality of signal connection through holes 22, a plurality of signal connection patterns 21 and a plurality of measuring contact seats 20 are respectively implemented on the substrate 30 corresponding to the plurality of BGA contact seats 10.

The operation of the measuring mechanism for a BGA-IC having the arrangement set forth above will be now described as follows.

(1) The contact between the soldering ball 41 and the BGA contact seat 10 can be facilitated and assured.

As described hereinbefore, the measuring mechanism for a BGA-IC is a mechanism for testing the packaged BGA-IC 40 and the package of the BGA-IC 40 in its electric characteristics when it is assembled. In the measuring mechanism for a BGA-IC, the assembled or packaged BGA-IC 40 are first disposed over the substrate 30 (FIG. 3) and the soldering balls 41 are forced to contact the conical contact surfaces 10A of the corresponding BGA contact seats 10. In this case, the diameter of each BGA contact seat 10 is set to be slightly larger than that of the soldering ball 41, whereby the soldering ball 41 is accommodated in the conical contact surface 10A as shown in FIG. 1(B).

Further, the soldering ball 41 and the conical contact surface 10A of the BGA contact seat 10 contact each other in a line contact mode. That is, the contact mode between the soldering ball 41 and the conical contact surface 10A is not a point contact as made in the conventional measuring mechanism for a BGA-IC (FIG. 4(B)), but is a line contact where the entire outer periphery 41A of the soldering ball 41 contacts the conical contact surface 10A (FIG. 1(B) and FIG. 2).

Figure 2:
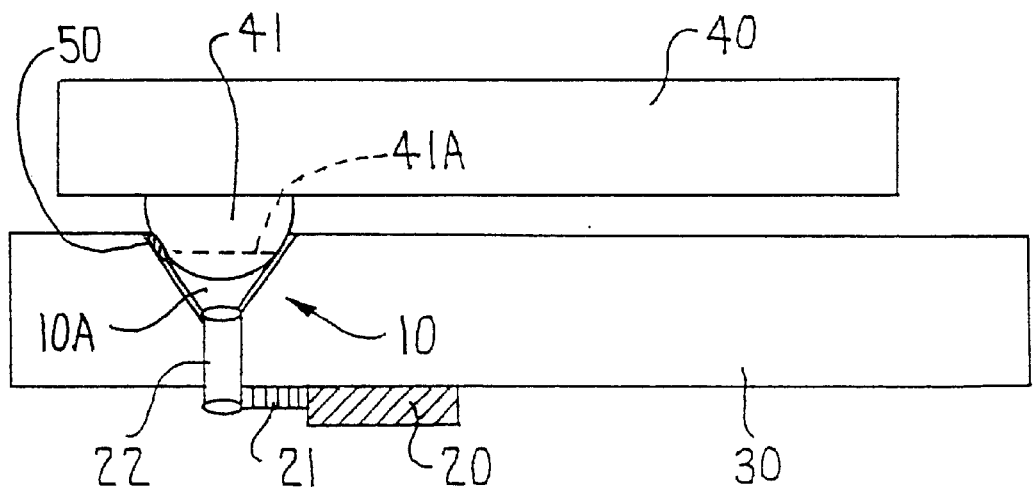
FIG. 2 is a view showing the operation of the measuring mechanism for the BGA-IC in FIG. 1.

Accordingly, as shown in FIG. 2, even if the foreign matter 50 is sandwiched between the soldering ball 41 and the conical contact surface 10A, the soldering ball 41 and the conical contact surface 10A can contact each other at any part of the entire outer periphery 41A other than the part where the foreign matter 50 is sandwiched therebetween. Accordingly, the contact between the soldering ball 41 and the conical contact surface 10A can be further facilitated and assured.

Still further, according to the invention, since the BGA contact seat 10 has the conical contact surface 10A, the soldering ball 41 is accommodated in the inclined conical contact surface 10A (FIG. 1(B)) so that the soldering ball 41 can contact the BGA contact seat 10 in a stable condition, and hence assuring the contact therebetween.

(2) Measuring time can be shortened.

Since the soldering ball 41 and the conical contact surface 10A can contact each other easily and surely, it is not necessary to check the recontact therebetween, and hence the measuring time can be shortened by the time involved in checking.

Figure 4A:
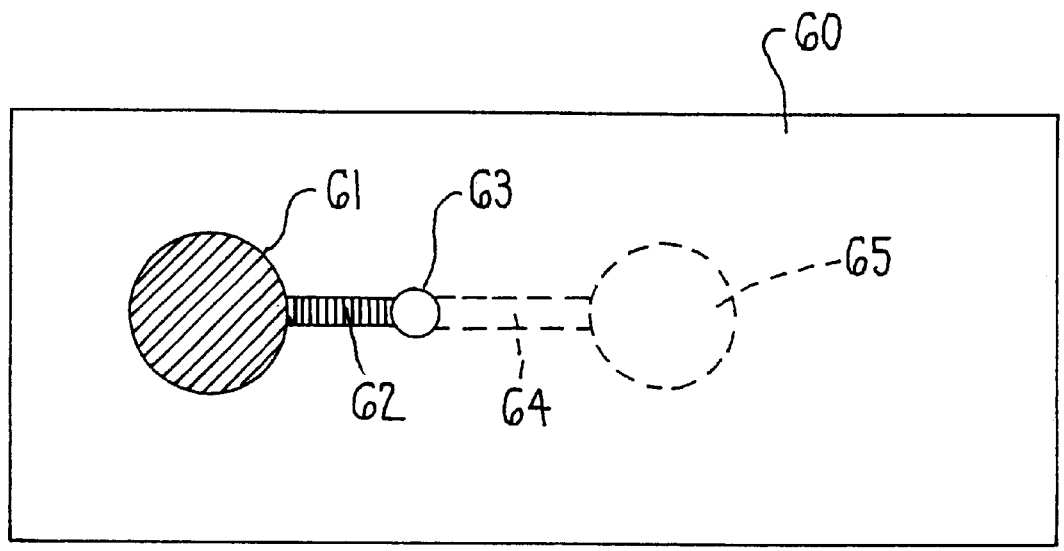
FIGS. 4(A) and 4(B) are views showing the arrangement of a conventional measuring mechanism for a BGA-IC.
Figure 4B:
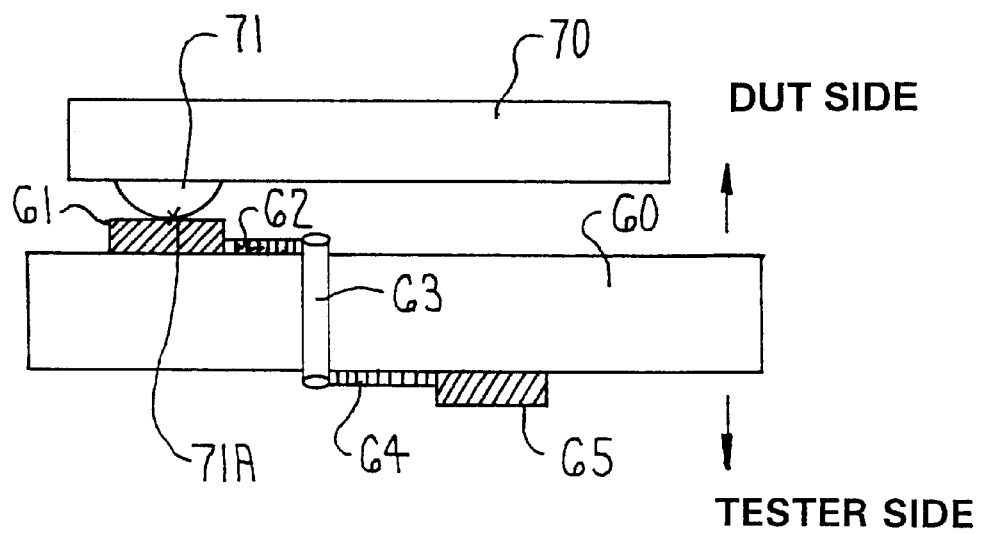
Figure 5:
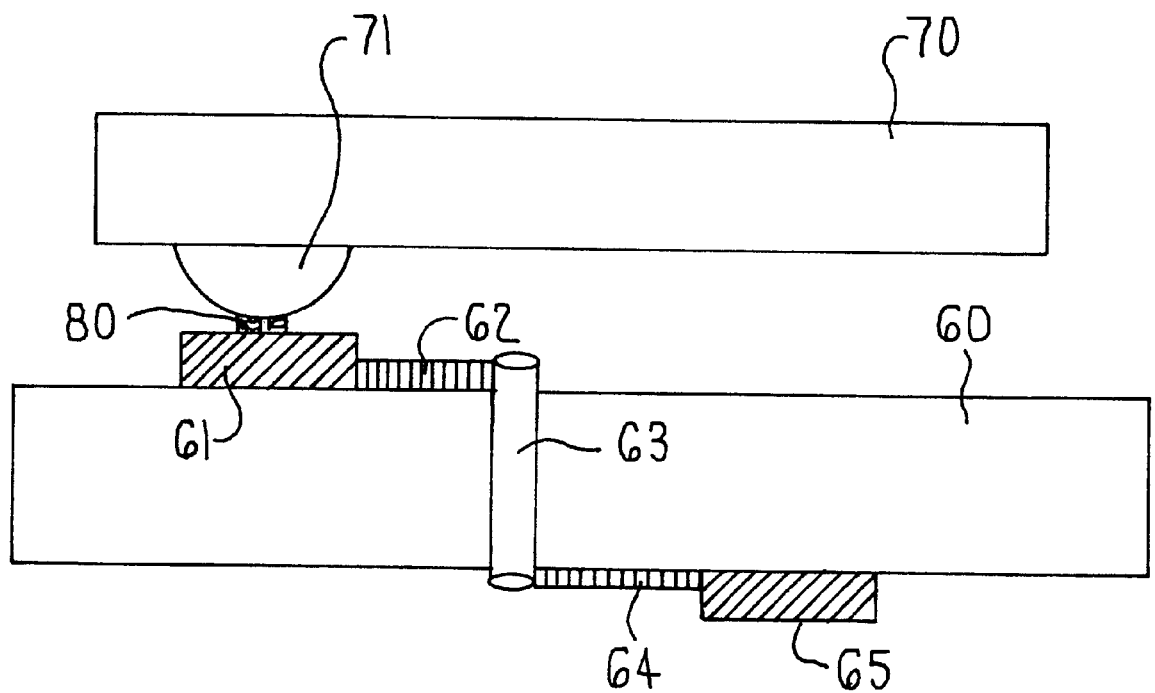
FIG. 5 is a view showing the operation of the conventional measuring mechanism for a BGA-IC in FIG. 4.

That is, the contact mode between the soldering ball 71 and the BGA contact seat 61 is a point contact in the conventional measuring mechanism for a BGA-IC (FIG. 4(B)), and hence the check of the recontact therebetween can be made if the foreign matter 80 is sandwiched therebetween (FIG. 5), and hence the measuring time has increased by that time.

However, according to the invention, since the soldering ball 41 can easily and surely contact the conical contact surface 10A, it is not necessary to check the recontact therebetween, and hence the measuring time is shortened by that time.

(3) The measuring mechanism for a BGA-IC can be made compact.

Further, the BGA contact seat 61 has connected to the measuring contact seat 65 through the signal connection pattern 62, the signal connection through hole 63 and the signal connection pattern 64 (FIG. 4(B)). That is, since the conventional BGA contact seat 61 is flat as mentioned above, and it is implemented on the surface of the substrate 60 at the DUT side, the signal connection pattern 62 is needed for connecting the BGA contact seat 61 to the signal connection through hole 63 as shown in FIG. 4(B). Still further, since the BGA contact seat 61 is implemented on the surface of the substrate 60 at the DUT side, the signal connection through hole 63 need be penetrated from the front surface to the back surface of the substrate 60 for connecting the BGA contact seat 61 to the measuring contact seat 65 which is implemented on the back surface of the substrate 60 at the tester side opposite to the DUT side.

Figure 3:
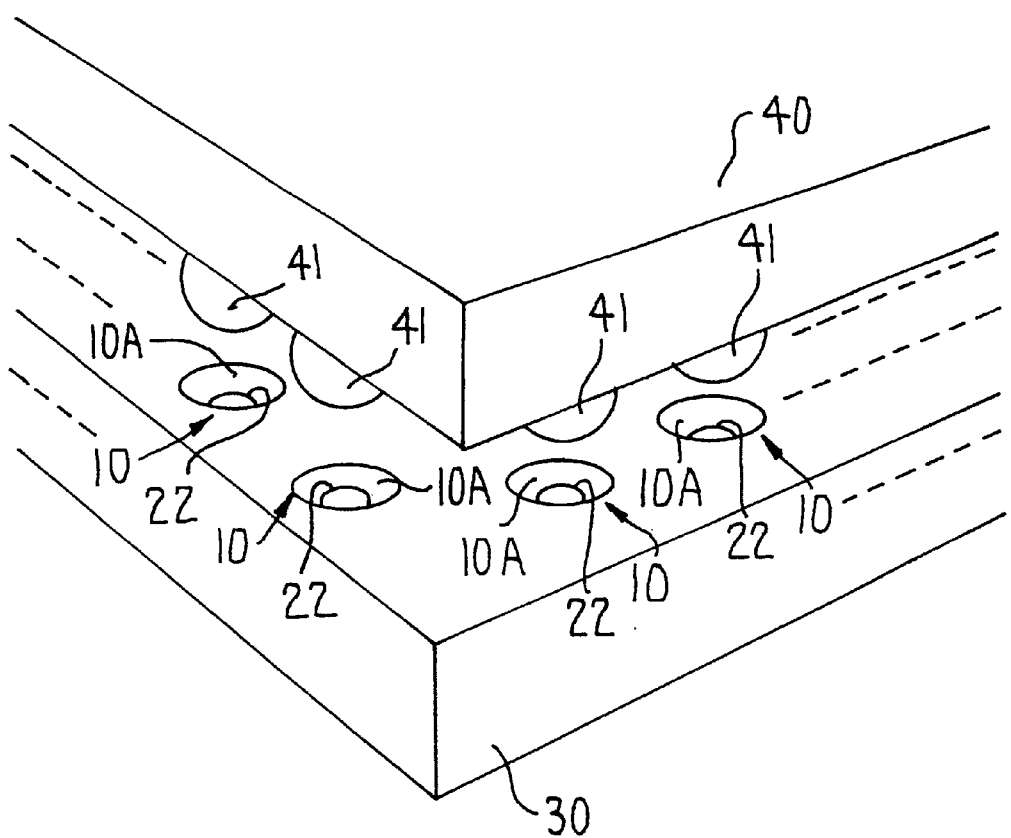
FIG. 3 is a view showing the relation between a BGA contact seat 10 and a BGA-IC 40.

However, according to the invention, the BGA contact seat 10 is provided with the conical contact surface 10A and it can be embedded into the substrate 30 as shown in FIGS. 1 to 3.

Accordingly, since the lower portion of the BGA contact seat 10 can be directly connected to the signal connection through hole 22, the signal connection pattern to be connected to the signal connection through hole 22 can be dispensed with.

Still further, since the signal connection through hole 22 may be penetrated in the midway of the substrate 30, it can be reduced in length compared with the conventional signal connection through hole 63.

Accordingly, each length of the signal connection pattern 21 and signal connection through hole 22 for connecting between the BGA contact seat 10 and the measuring contact seat 20 can be reduced, so that the measuring mechanism for a BGA-IC is made compact compared with the conventional measuring mechanism for a BGA-IC.

As mentioned in detail above, the measuring mechanism for a BGA-IC comprises the substrate 30 including the BGA contact seat 10 embedded therein and having a conical contact surface 10A, wherein the BGA contact seat 10 is connected to a tester, and wherein the soldering ball 41 of the BGA-IC 40 is forced to contact the conical contact surface 10A of the BGA contact seat 10 when the BGA-IC 40 is tested.

Accordingly, since the soldering ball can contact the conical contact surface in a line contact mode, they can contact each other easily and surely at any part of the conical contact surface even if the foreign matter is sandwiched therebetween, thereby saving the time involved in checking the recontact therebetween to reduce the measuring time. Still further, the signal connection pattern for connecting the BGA contact seat and the signal connection through hole is dispensed with, and also the length of the signal connection through hole is reduced so that each length of the signal connection pattern and signal connection through hole is reduced as a whole. As a result, the measuring mechanism for a BGA-IC is made further compact.

What is claimed is:

1. A testing mechanism for a ball grid array-IC comprising:

a platelike substrate having outer and tester surfaces defined on opposite sides thereof, and a plurality of ball-receiving contact seats which in their entirety are embedded in the substrate so as to not protrude beyond said outer surface, each said contact seat having an interior conical contact surface which is completely recessed below said outer surface, said interior conical contact surface having an open base end defined at said outer surface and an apex end defined between said outer and tester surfaces;

a measuring contact seat and a signal connection pattern connected thereto and implemented on said substrate at said tester surface thereof for each said ball-receiving contact seat, the apex end of each said ball-receiving contact seat being connected to one open end of a signal connection through hole which is formed in the substrate in axial alignment with the respective conical contact surface and which at the other open end thereof opens through the tester surface of said substrate and is connected to the measuring contact seat through the signal connection pattern; and a ball grid array-IC having a plurality of soldering balls arrayed thereon for contact with the respective conical surfaces of the ball-receiving contact seats when the ball grid array-IC is tested, each said ball creating a line contact which surrounds the ball where the ball contacts the respective interior conical contact surface, wherein each of the signal connection through holes defines an open path from the apex end of the respective said ball-receiving contact seat to the open end of the respective signal connection through hole at the tester surface so that debris is capable of passing through each said ball-receiving contact seat and each respective said signal connection through hole.

2. A testing mechanism for a ball grid array integrated circuit comprising:

a plate-shaped substrate having array and tester surfaces defined on opposite sides thereof;

a plurality of ball receiving contact seats which in their entirety are embedded in the substrate so as to not protrude beyond said array surface, each said contact seat having an interior conical contact surface which is completely recessed below said array surface and electrically conductive over the entirety thereof, each said interior contact surface having an open base end defined adjacent the array surface and an apex end defined between and spaced from said array and tester surfaces;

signal connection through holes having a constant diameter and an open tip end located at said tester surface, each said through hole having an opposing end opening into and electrically connected to the apex end of a respective said ball receiving contact seat so that the length thereof is less than the thickness of said substrate, an axis of each said through hole being perpendicular to planes defined by said array and tester surfaces, and an axis for each of said ball receiving contact seats being axially aligned with the axis of the respective signal connection through hole, the signal connection through holes each providing a continuous opening from the apex of the respective ball-receiving contact seat to the tester surface;

measuring contact seats mounted on the tester surface adjacent respective said through holes;

signal connection patterns connected to respective said measuring contact seats and implemented on said substrate at said tester surface thereof for each said ball-receiving contact seat, the signal connection patterns extending from the measuring contact seats to the respective tip ends of the respective signal connection through holes at the tester surface thereof to provide an electrical connection therebetween; and a ball grid array integrated circuit having a plurality of substantially hemispherical soldering balls arrayed thereon for contact with the respective interior conical contact surfaces of the ball-receiving contact seats when the ball grid array integrated circuit is tested, each said soldering ball having a diameter slightly less than the diameter of the corresponding ball-receiving contact seat at the open base end thereof and each said soldering ball creating a circular line contact about a periphery of a lower portion of the soldering ball when the ball contacts the respective interior conical contact surface, each said line contact ensuring an electrical connection between the soldering ball and the respective ball-receiving contact seat, whereby the ball-receiving contact seats and the soldering balls provide an electrical connection even in the presence of foreign material sandwiched between a portion of any of the ball-receiving contact seats and the respective soldering balls such that only a portion of the line contact enables the electrical connection;

whereby the testing mechanism enables the soldering balls of the ball grid array-IC to be moved into line contact with the respective contact seats so as to reduce measuring time for testing a ball grid array integrated circuit by eliminating rechecking of the electrical contact between the soldering balls and the respective ball-receiving contact seats due to the reliability of the line contact created, and wherein a gap exists between a ball protruding surface of the ball grid array-IC and the array surface of the substrate when the ball receiving contact seats provide a line contact with the respective soldering balls.

3. The resting mechanism of claim 2, wherein the signal connection through holes each include a conductive wall for providing the electrical connection between the respective ball-receiving conical seat and the respective signal connection pattern.

* * * * *